United States Patent [19]

Augusto

[11] Patent Number: 5,493,986
[45] Date of Patent: Feb. 27, 1996

[54] METHOD OF PROVIDING VLSI-QUALITY CRYSTALLINE SEMICONDUCTOR SUBSTRATES

[76] Inventor: Carlos J. R. P. Augusto, Trv. Escola Araujo No. 5, 2 DTO, P-1100 Lisbon, Portugal

[21] Appl. No.: 360,692
[22] PCT Filed: May 13, 1993
[86] PCT No.: PCT/EP93/01206
§ 371 Date: Jan. 5, 1995
§ 102(e) Date: Jan. 5, 1995
[87] PCT Pub. No.: WO94/27321
PCT Pub. Date: Nov. 24, 1994

[51] Int. Cl.⁶ ........................... C30B 23/04
[52] U.S. Cl. .............. 117/90; 117/94; 117/97; 117/915; 437/974
[58] Field of Search ............. 117/90, 94, 97, 117/915; 437/974

[56] References Cited

U.S. PATENT DOCUMENTS 3,740,280 6/1973 Ronew.
4,174,217 11/1979 Platley .................... 437/229
4,626,878 12/1986 Kuwano et al. .............. 257/53
5,110,748 5/1992 Sarma .................... 437/974
5,399,231 3/1995 McCarthy ................ 437/974

FOREIGN PATENT DOCUMENTS 0117957 9/1984 European Pat. Off.
0272506 6/1988 European Pat. Off.
0484842 5/1992 European Pat. Off.

Primary Examiner—Robert Kunemund
Attorney, Agent, or Firm—Henderson & Sturm

[57] ABSTRACT

A method is described which makes it possible to use VLSI-quality crystalline semiconductor substrates for the fabrication of the active devices of Active Matrix Flat Panels (AMFPD). The VLSI substrates are provided by arranging a layer of light transparent material in those areas of a semiconductor wafer in which no active device has to be provided, eliminating the semiconductor wafer whereby a transparent wafer is obtained with crystalline semiconductor regions therein and then shaping the transparent wafer into a sized module unit. Several module units can be bonded to a glass substrate and a conductive material is then deposited to make electrical interconnections between the module units. The bonding operation can be performed either at room temperature using a light-transparent glue or at higher temperature using a wafer bonding technique known in the art of Silicon-On-Insulator technology.

12 Claims, 8 Drawing Sheets

5,493,986

METHOD OF PROVIDING VLSI-QUALITY CRYSTALLINE SEMICONDUCTOR SUBSTRATES

FIELD OF THE INVENTION

The present invention relates generally to the fabrication of Active Matrix Flat Panel Display (AMFPD) devices, and more particularly, to a method of providing VLSI-quality crystalline semiconductor substrates for use in the production of AMFPDs, of which Active Matrix Liquid Crystal Displays (AMLCDs) are given as an example of application.

BACKGROUND OF THE INVENTION

It is widely acknowledged that the most important cause of reduction in yield in high volume production of large area AMFPDs is the high number of damaged active devices. The main causes for having damaged devices are the high defect density and also the grain boundaries that exist in the material which the substrates are made of. These causes place unavoidable limits on device dimension down-scaling, and therefore on circuit redundancy, as well as pixel size and density.

AMFPD devices are currently fabricated on amorphous silicon substrates. The use of amorphous silicon results from the fact that it is not possible to produce crystalline substrates by simply depositing silicon on an amorphous starting material such as glass. Although it is possible to obtain polycrystalline substrates, their fabrication requires more expensive starting materials to be used and/or more processing steps to be applied.

The standard LCD fabrication has been disclosed by W. C. O'Mara in "Active Matrix Liquid Crystal Displays Part I: Manufacturing Process", Solid State Technology December 1991, pp. 64–69, and statistics for the causes of failure of assembled panels are reported therein.

In the article "Present and Future Trend of Electron Device Technology in Flat Panel Display" by T. Uchida, IEEE IEDM Technical Digest 1991, pp. 1.2.1–1.2.6, there is disclosed a formula for the yield of LCD panels as a function of the defect density, circuit redundancy, pixel density, and total area of the panel.

The possibility of having a high quality crystalline semiconductor substrate, like the silicon wafers employed in VLSI technology, would drastically reduce the surface defect density, with a consequent reduction in the number of damaged devices and thereby a major improvement in the manufacturing yield.

SUMMARY OF THE INVENTION

The object of the present invention is a method of providing VLSI-quality crystalline substrates for use in mass production of AMFPDs.

Another object of the invention is to provide VLSI-quality crystalline substrates which are effective to improve the quality of transmission type AMFPDs.

These and other objects are attained in accordance with this invention by a method of providing a VLSI-quality crystalline substrate comprising a lithographic step to define the substrate areas which are not to be used for implementing active devices and the selected areas are etched to a certain depth and filled with a transparent material, such as silicon dioxide. After a planarization operation which uncovers the unetched silicon area and provides a flat surface, the wafers next undergo all the processing steps known per se for realizing the active matrix. Thereafter, the back sides of the wafers are thinned and polished with the previously deposited silicon dioxide acting as a polish stop. After being sawed to a sized rectangular format, the wafers are aligned on top of a glass substrate with their backsides facing the glass and with the spacing between their edges being smaller than what the distance a human eye can resolve. The wafers are permanently bonded to the glass substrate, and a conductive material is then deposited to make electrical interconnections between the wafer pieces. From then on, the usual AMLCD manufacturing procedures are performed.

The bonding operation can be performed using different techniques. For instance, the bonding operation can be performed at room temperature using a light-transparent glue, e.g. silicone, or at higher temperature using a wafer bonding technique known in the art of silicon-or-insulator technology. It is to be noted that when using a wafer bonding technique, the active devices may be realized either before or after the bonding operation.

This invention makes it possible to provide AMFPDs using VLSI-quality crystalline substrates instead of amorphous or polycrystalline substrates, thus resulting in higher fabrication yields and devices having superior electrical performance and higher integration density capability. In addition, by virtue of providing a light-transparent substrate in those areas where no active devices are formed, the invention allows a high level light transmission through the substrate for each pixel.

Further, this invention has a number of additional advantages in fabricating large area AMFPDs. The invention permits modular AMFPDs to be realized using a plurality of interconnected smaller devices with the consequent result that the fabrication yield of the device is a function of the wafer area and not of the total panel area.

In case the active devices are formed before the bonding operation, the invention allows the smaller modules to be tested and repaired before being used and further allows bonding only those modules in which all the devices are working. Therefore, the production yield of the complete display device only depends on the other fabrication steps. Optimising the design of a display device does not depend on the display size, but on the size of the wafers that are used. For any screen size or format, use can be made of a standard processing equipment as used in the fabrication of integrated circuits, thereby decoupling the processing equipment from the size of the display device.

DESCRIPTION OF SPECIFIC EMBODIMENTS

Figure 1:
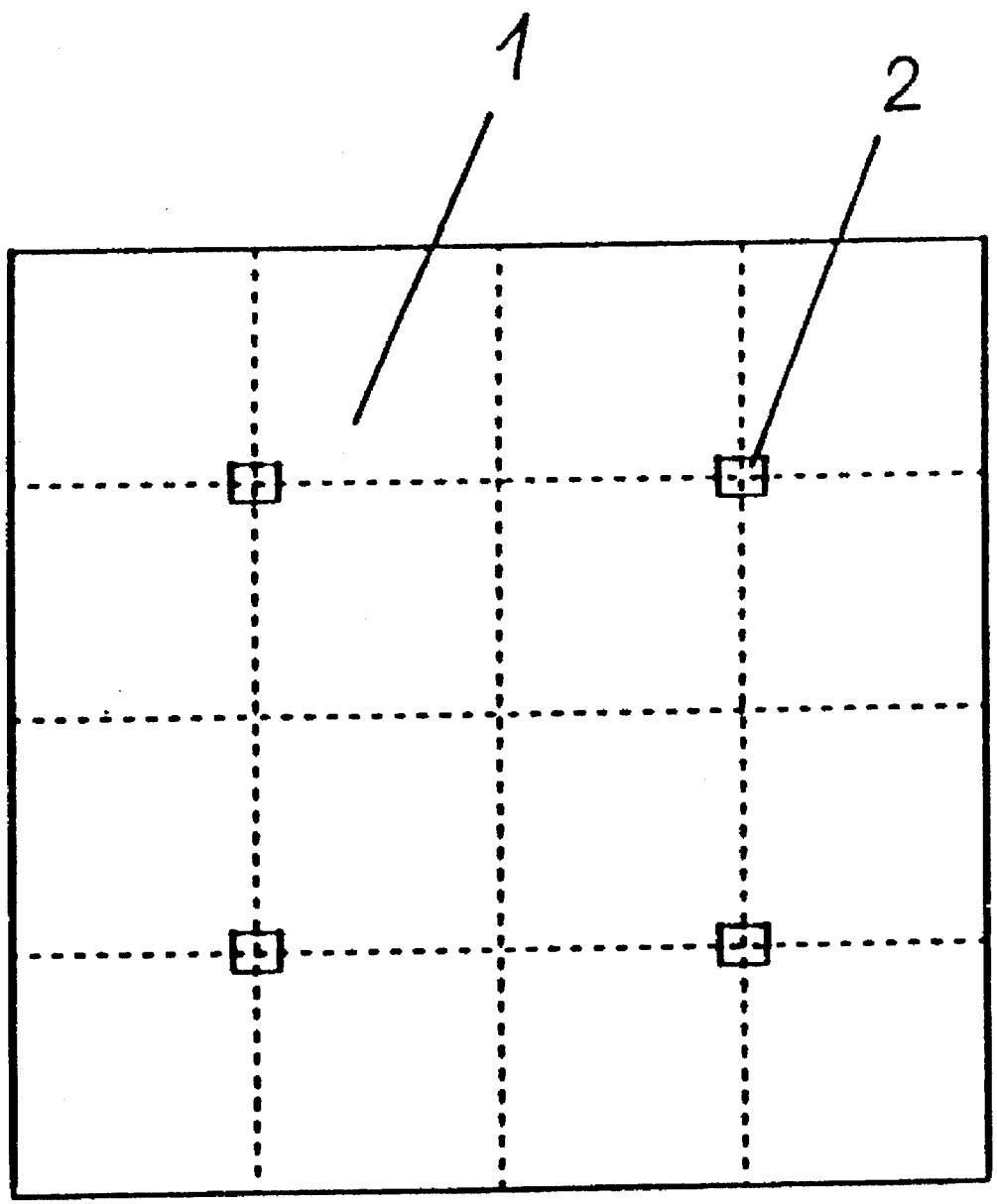
FIG. 1 is a top view of a portion of semiconductor wafer, in which the individual pixel active and passive areas are lithographically defined.

Referring to FIG. 1, there is shown a portion of a semiconductor wafer. The dashed lines identify the individual pixel areas. On the surface of wafer two types of areas are defined using a standard lithographic technique: the areas 1 where no active devices have to be provided and areas 2 where active devices are to be formed.

Figure 2:
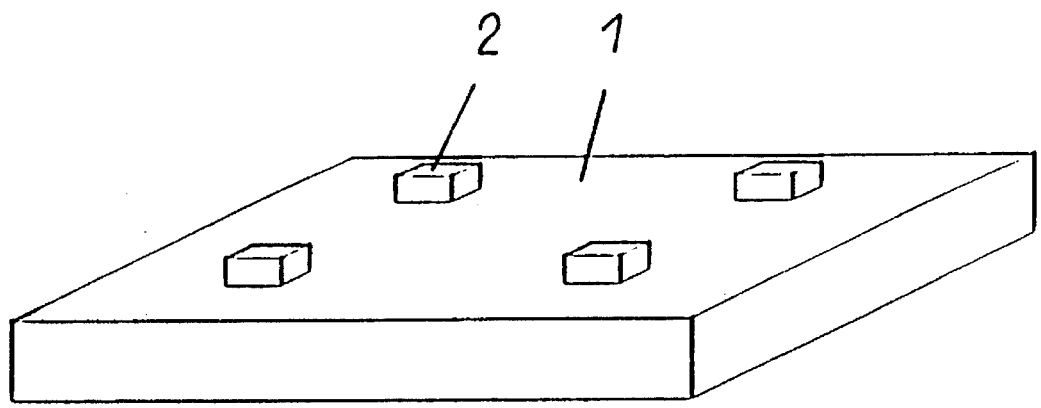
FIGS. 2 and 3 show an exemplary way of forming the light-transparent layer on the semiconductor wafer of FIG. 1.
Figure 3:
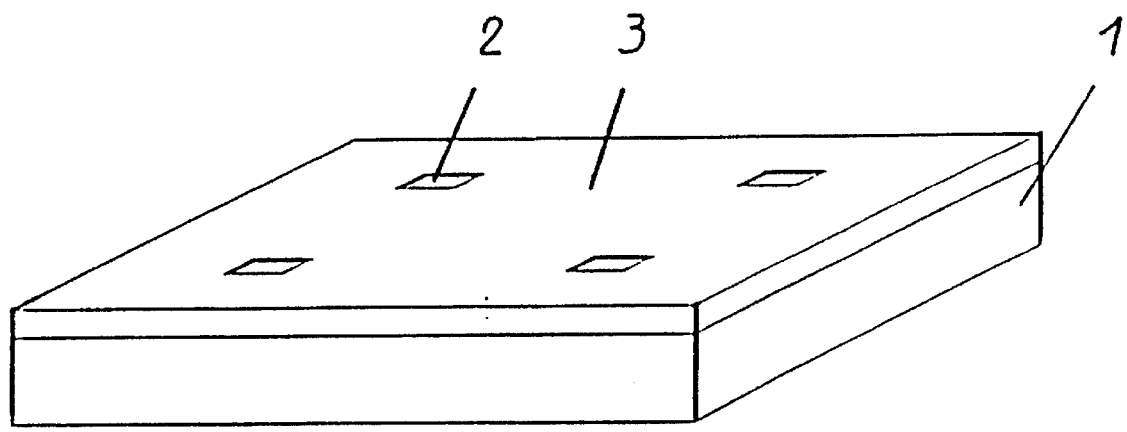

In accordance with this invention, a layer of light-transparent material is arranged in the areas 1. Referring to FIGS. 2 and 3 there is shown an exemplary way of forming the light-transparent layer in the areas 1. The semiconductor material is removed from the areas 1 (FIG. 2) using an etch procedure known per se. The unetched areas 2 are so defined. A layer 3 of light-transparent material is then deposited on the areas 1, to fill the holes formed by the etch procedure. This can be achieved by performing, for example, Physical Vapour Deposition (PVD) or Chemical Vapour Deposition (CVD) of silicon dioxide. A planarization operation is then performed (FIG. 3) to uncover the semiconductor crystalline areas 2. The planarization operation can be done, for instance, by Chemical Mechanical Polish (CMP). This CMP technique is disclosed in the article "A New Planarization Technique Using a Combination of RIE and Chemical Mechanical Polish (CMP)" by B. Davari, C. W. Koburger, R. Schulz, J. D. Warnock, T. Furukawa, M. Jost, Y. Taur, W. G. Schwittek, J. K. DeBrosse, M. L. Kerbaugh, and J. L. Mauer, in IEEE IEDM Technical Digest 1989, pp. 61–64, the content of which is incorporated herein by reference.

Figure 4:
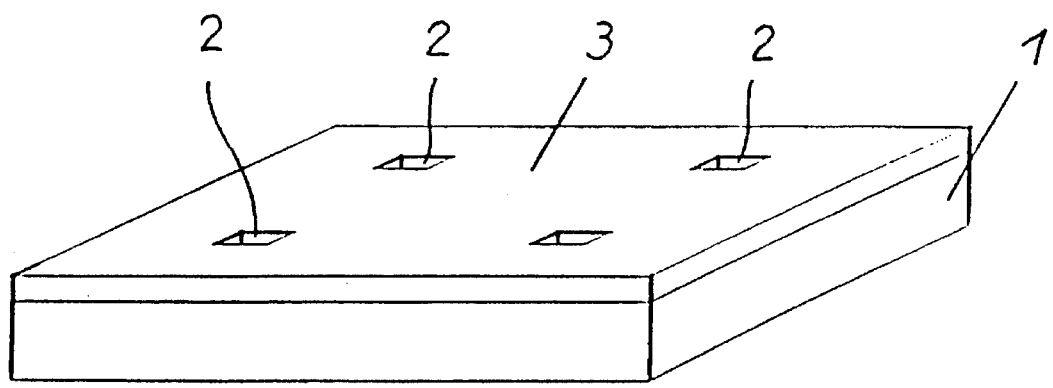
FIGS. 4 and 5 show an alternative way of forming the light-transparent layer on the semiconductor wafer of FIG. 1.
Figure 5:
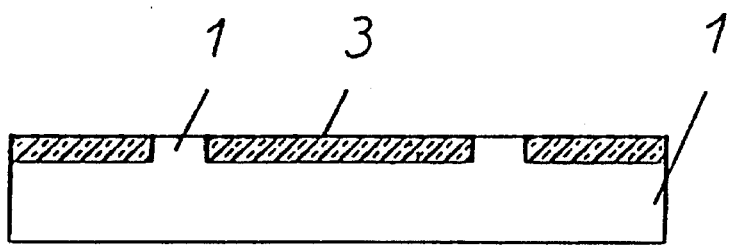

An alternative way of forming the light-transparent layer in the areas 1 is illustrated in FIGS. 4 and 5. Following this procedure, a layer 3 of light-transparent material is first deposited onto the semiconductor wafer (FIG. 4) and through lithography,, the areas 2 are defined where active devices are to be provided. The light-transparent material is then etched in the areas 2 down to the semiconductor substrate 1. Thereafter, the crystalline semiconductor is epitaxially grown in those areas 2 until the upper level of the light-transparent layer 3 is reached (FIG. 5).

Figure 6:
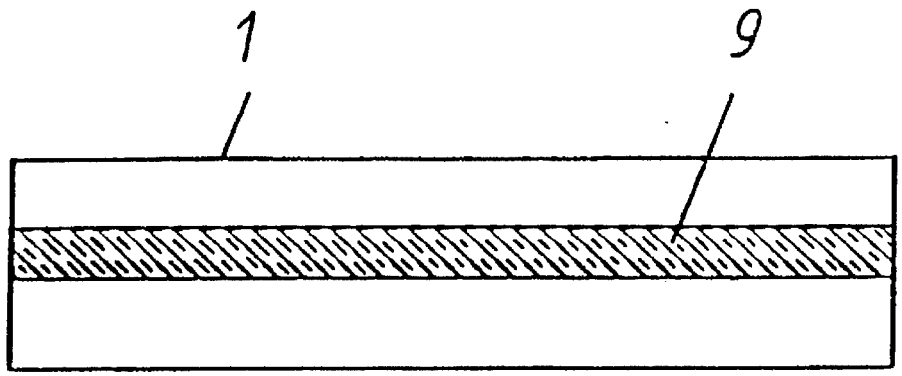
FIGS. 6 and 7 show another alternative way of forming the light-transparent layer on the semiconductor wafer of FIG. 1.
Figure 7:
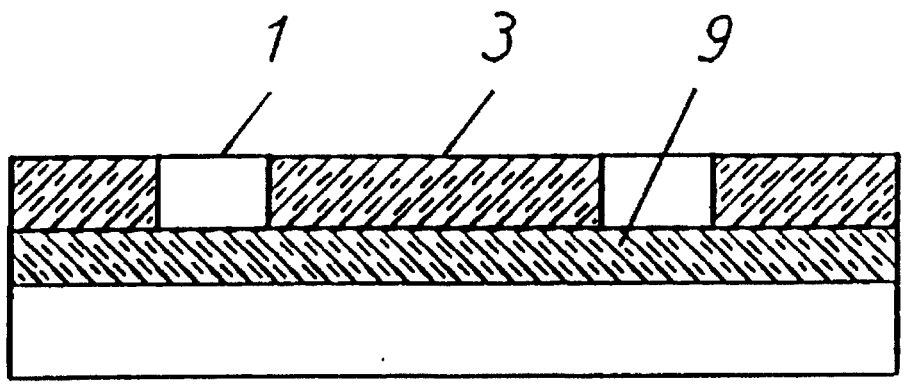

Another alternative way of providing a layer of light-transparent material in those areas where no active devices have to be provided is illustrated in FIGS. 6 and 7. The procedure uses a semiconductor wafer 1 shown in FIG. 6, having a buried light-transparent layer 9, e.g. a known SIMOX wafer. In the areas where no active devices have to be provided, the top crystalline layer is etched down to the buried light-transparent material 9 and thereafter the etched areas are filled with a light-transparent material 3 (FIG. 7).

The semiconductor wafer with a light-transparent layer 3 arranged thereon is then ready to undergo all the processing steps of a given technology in order to make the active matrix that will switch the pixels. The active devices are made on regions 2. The lines and rows of their interconnections are made over regions 3.

Any other processing step used in the standard fabrication of active matrices, e.g. ITO sputtering in order to have a transparent electrode for each pixel, is also effected at this point of the process.

Figure 8:
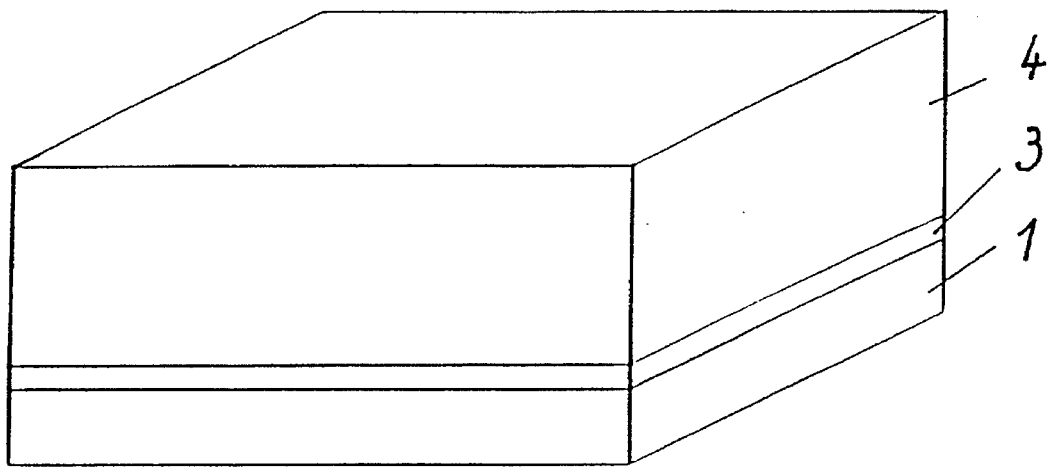
FIGS. 8 to 11 illustrate the subsequent method steps according to the invention up to the realization of a module unit.

Next, a mechanical support 4 is attached to the layer 3 by using a sacrificial adhesive (FIG. 8).

Figure 9:
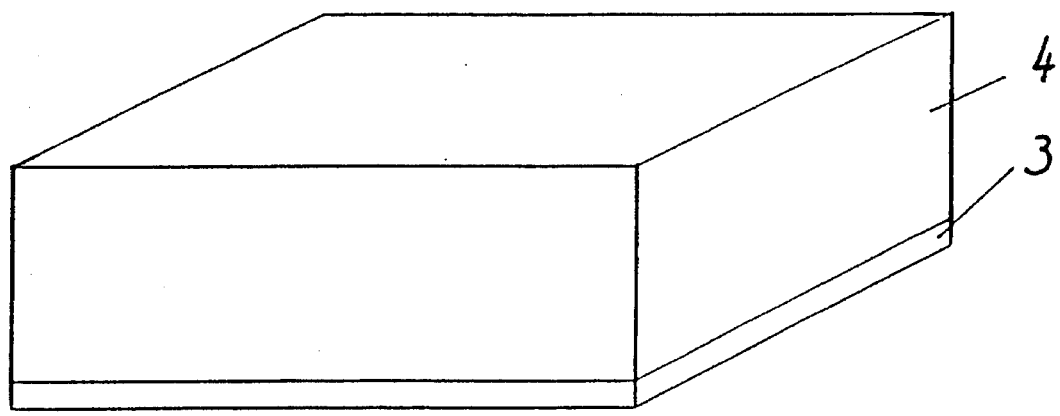

The wafer 1 is then removed (FIG. 9) using a known thinning and polishing process, for instance preferential polishing, the light-transparent material also acting as an etch stop. In this regard, reference may be had to the following literature, the content of which is incorporated herein by reference: "Novel LSI/SOI Wafer Fabrication using Device Layer Transfer Technique" by T. Hamaguchi, N. Endo, M. Kimura and M. Nakamae, IEEE IEDM Technical Digest 1985, pp. 688–691, and "Silicon Device Thinning Using Preferential Polishing: Progress in Flatness and Electrical Properties" by S. Wada, S. Takahashi and Y. Hayashi, Semicon. Sci. Technol. 7, Number 1A, (1992) A243–A248.S.

Figure 10:
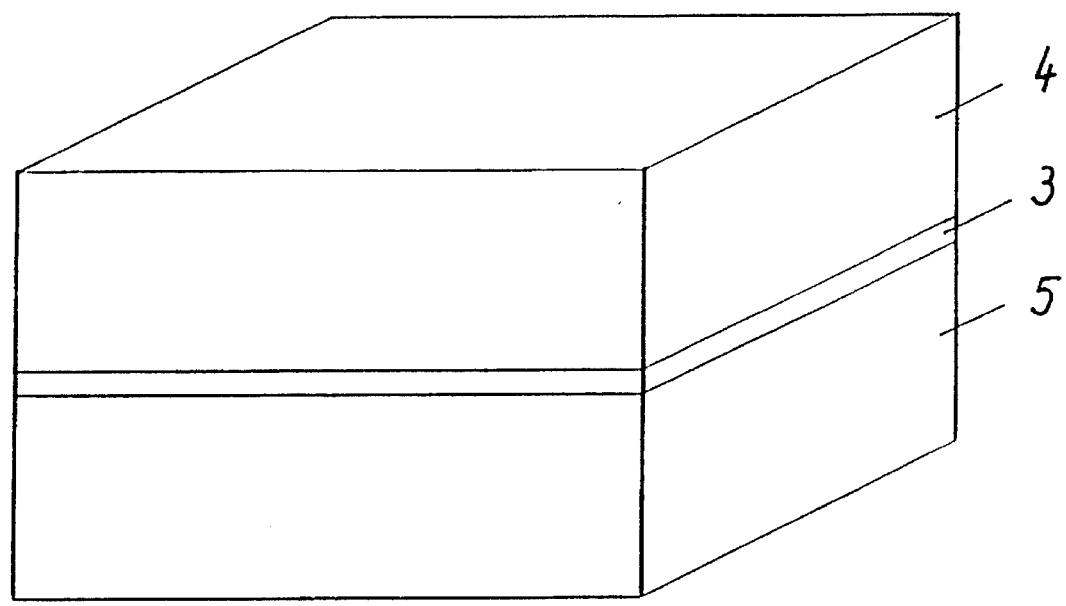

The wafer is now sawed to the size and format of the display being fabricated. The back side of the sawed and thinned wafer is now permanently bonded to a glass substrate 5 (FIG. 10).

The bonding operation can be achieved using a light-transparent glue, e.g. silicone, or by a low temperature variation of a wafer bonding technique known in the art of silicon-on-insulator technology.

The wafer bonding technique operating at a high temperature of approximately 1000° C. is described in "Silicon-On-Insulator (SOI) by Bonding and Etch-Back", by J. B. Lasky, S. R. Stiffler, F. R. White and J. R. Abernathey IEEE IEDM Technical Digest 1985, pp. 684–687, the content of which is incorporated herein by reference.

Many lower temperature (<450° C.) variations of this process have been developed. For example, reference may be had to Leslie A. Field and Richard Müller: "Fusing Silicon Wafers with Low Melting Tempereature Glass" Sensors and Actuators, A21–A23 (1990) 935–938.

Also reference may be had to the following Extended Abstracts, Volume 91-2 of the Fall Meeting of The Electrochemical Society, Oct. 13–17 1991: "Low Temperature Silicon Wafer Bonding for Micromechanical Applications" by H.-J. Quenzer and W. Benecke, Abstract No. 463, pp. 684; "Silicon Nitride as a Dielectric for Low Temperature Direct Wafer Bonding" by K. Pastor, A. M. Hoff and L. Jastrzebski, Abstract No. 468, pp. 692; "Wafer-Scale Integration Using Restructurable VLSI" by W. P. Eaton, S. Risbud and R. L. Smith, IEEE Computer, April 1992.

When the bonding operation is carried out using a light transparent glue, the wafers must be processed before the bonding operation is performed because the glue cannot withstand high temperatures. In order to achieve a high transparency to visible light, the wafer is first thinned.

When the bonding operation is effected using a wafer bonding technique, the active devices, e.g. thin film transistors (TFTs) can be realized either before or after the bonding operation.

Figure 11:
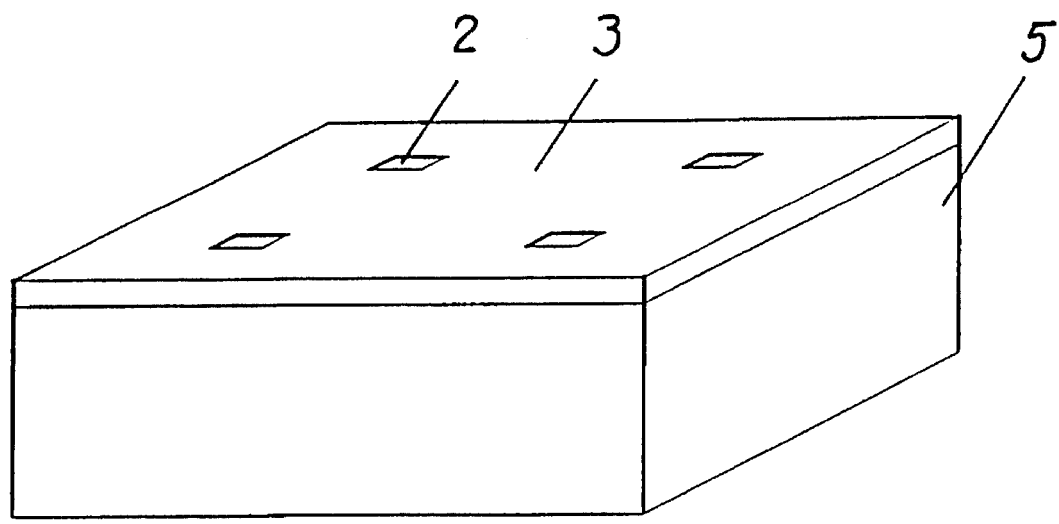

Next, referring to FIG. 11, the mechanical support 4 and the adhesive used to attach the sawed wafer onto it, are removed.

The processed side of the wafer is covered with an orientation film, and from then on, the usual LCD production procedures are carried out.

Figure 12:
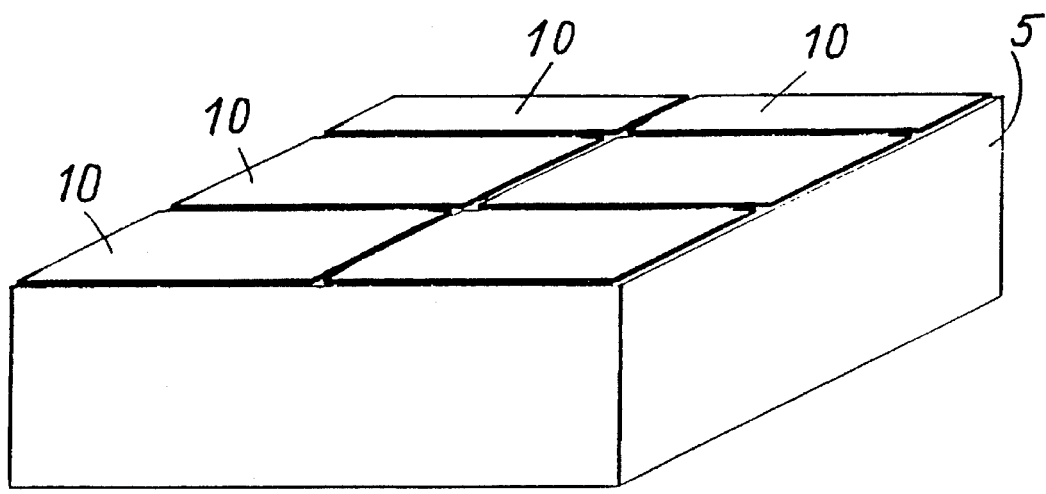
FIGS. 12 and 13 illustrate the modular fabrication of a large LCD device by bonding several sawed wafers to a common glass substrate and electrically interconnecting them.
Figure 13:
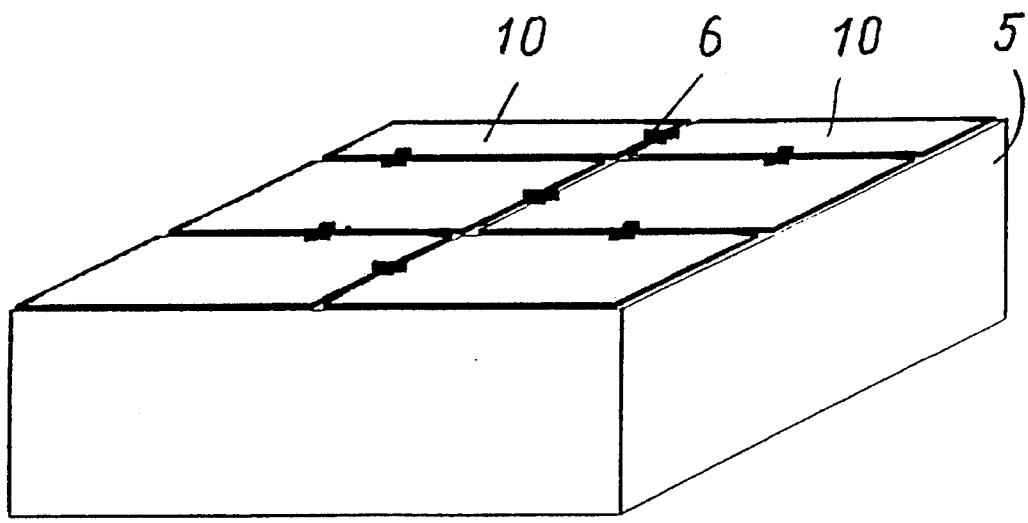
Figure 14:
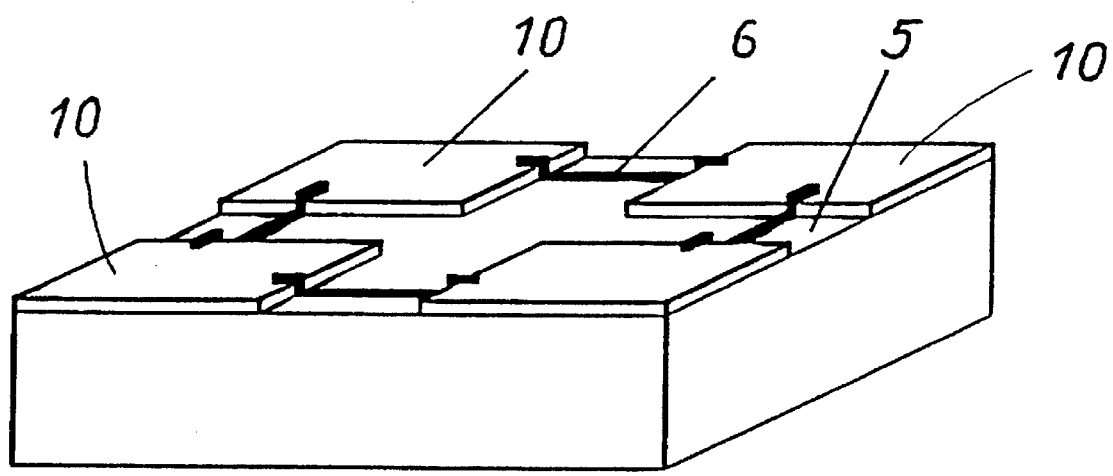
FIG. 14 is an enlarged view of a portion of the device shown in FIG. 13.

Large display devices can be fabricated in a modular scheme by aligning and bonding several sawed and thinned wafers to a common glass substrate at a spacing smaller than the distance which can be resolved by the human eye. FIG. 12 shows an exemplary arrangement of six module units 10 on a common glass substrate 5. Electrical connections 6 are then made between the module units (FIGS. 13 and 14) whereby they behave electrically as a single panel. These connections can be made, for instance, using restructurable VLSI technology (known per se).

Thereafter, the top side of the device may be covered with an orientation film. The standard LCD production procedures can now be carried out.

I claim:

1. A method of providing a crystalline semiconductor substrate for use in the production of active matrix liquid crystal display devices, comprising the steps of:
   (a) arranging a layer of light transparent material in areas of a semiconductor wafer in which no active device has to be provided,
   (b) eliminating said semiconductor wafer whereby a transparent wafer is obtained, said transparent wafer comprising crystalline semiconductor regions, and
   (c) shaping said transparent wafer into a sized module unit.

2. The method of claim 1, wherein the step of arranging a layer of light transparent material in said areas of a semiconductor wafer in which no active device has to be provided comprises:
   forming areas in a semiconductor wafer in which no active device has to be provided, and
   depositing light transparent material in said areas.

3. The method of claim 1, wherein the step of arranging a layer of light transparent material in areas of a semiconductor wafer in which no active device has to be provided comprises:
   depositing a layer of light transparent material,
   through lithography, defining other areas where active devices have to be provided,
   etching light transparent material in said areas down to the crystalline semiconductor substrate, and
   epitaxially growing a crystalline semiconductor in said areas until an upper level of said light transparent material is reached.

4. The method of claim 1, wherein the step of eliminating said semiconductor wafer (step b) comprises an operation comprising thinning and polishing said semiconductor wafer.

5. The method of claim 1, further comprising the step of:
   forming electrical connections for interconnecting individual active devices, thereby forming an active matrix.

6. The method of claim 4, further comprising the steps of:
   bonding several module units to a glass substrate using a light transparent glue, and
   forming electrical connections for interconnecting said module units.

7. The method of claim 2, wherein the step of eliminating said semiconductor wafer (step b) comprises an operation comprising thinning and polishing said semiconductor wafer.

8. The method of claim 2, further comprising the step of:
   forming electrical connections for interconnecting individual active devices, thereby forming an active matrix.

9. The method of claim 7, further comprising the steps of:
   bonding several module units to a glass substrate using a light transparent glue, and
   forming electrical connections for interconnecting said module units.

10. The method of claim 3, wherein the step of eliminating said semiconductor wafer (step b) comprises an operation comprising thinning and polishing said semiconductor wafer.

11. The method of claim 3, further comprising the step of:
    forming electrical connections for interconnecting individual active devices, thereby forming an active matrix.

12. The method of claim 10, further comprising the steps of:
    bonding several module units to a glass substrate using a light transparent glue, and
    forming electrical connections for interconnecting said module units.

* * * * *